United States Patent [19]
Suzuki et al.

[11] Patent Number: 5,177,434
[45] Date of Patent: Jan. 5, 1993

[54] IC TEST EQUIPMENT HAVING A HORIZONTALLY MOVABLE CHUCK CARRIER

[75] Inventors: Kempei Suzuki; Hiroto Nakamura, both of Saitama, Japan

[73] Assignee: Advantest Corporation, Tokyo, Japan

[21] Appl. No.: 770,317

[22] Filed: Oct. 3, 1991

[30] Foreign Application Priority Data

Oct. 8, 1990 [JP] Japan ............................. 2-105743[U]

[51] Int. Cl.$^5$ .................. G01R 31/22; B65G 47/24
[52] U.S. Cl. ..................... 324/158 F; 324/158 R; 414/422; 414/425; 198/395
[58] Field of Search ........... 324/158 R, 73.1, 158 F; 414/222, 223, 224, 225, 416, 788, 789; 901/40; 209/573, 576; 198/394, 395

[56] References Cited

U.S. PATENT DOCUMENTS

| | | | |
|---|---|---|---|
| 4,936,329 | 6/1990 | Michael et al. | 414/225 |
| 4,938,654 | 7/1990 | Schram | 414/225 |
| 4,950,982 | 8/1990 | Obikane et al. | 324/158 F |
| 4,984,953 | 1/1991 | Nakazato et al. | 414/225 |
| 4,997,552 | 3/1991 | Schlinkmann et al. | 209/573 |

*Primary Examiner*—Vinh Nguyen
*Attorney, Agent, or Firm*—Staas & Halsey

[57] ABSTRACT

A tray, on which IC elements to be tested are arranged at a pitch P1, is disposed at a first position, a performance board, which has a plurality of testing stations at a pitch P2, is disposed at a second position, and an IC chuck carrier is guided between the first and second positions by X-axis and Y-axis rails. The IC chuck carrier has a plurality of chuck heads arranged in a line and the pitch of arrangement of the chuck heads is selectively set, by a pitch switching device, to the pitch P1 or P2. The chuck heads are set to the pitch P1 on the tray and simultaneously chuck up therefrom a plurality of IC elements. Then, the chuck heads are brought to the second position, where the pitch of the chuck heads is switched to P2 and the IC chucked by the chuck heads are simultaneously attached to the plurality of testing stations.

7 Claims, 4 Drawing Sheets

IC TEST EQUIPMENT HAVING A HORIZONTALLY MOVABLE CHUCK CARRIER

BACKGROUND OF THE INVENTION

The present invention relates to IC test equipment for testing IC elements.

IC elements are classified into various types according to their terminal lead-off configuration. Of them, an IC element of the type having terminals led out from four sides of a flat plastic mold is particularly difficult to convey on a rail and what is called a horizontal carrier system using a tray has been employed for such IC elements. In the horizontal carrier system the tray loaded with a plurality of IC elements is brought to the vicinity of testing stations. The IC elements thus transported by the tray are each carried to the testing station by an IC chuck carrier provided with a chuck head supported by an X-Y driving mechanism and then mounted on an IC socket for electrical connection therethrough with a tester.

The IC chuck carrier is usually equipped with one chuck head, by which the IC elements are transferred, one at a time, from the tray to the testing stations. With such a structure which conveys the IC elements one by one to the testing stations, it is difficult to achieve a high-speed operation. In the case where a plurality of chuck heads are provided for speeding up the operation, a difference between the pitch of arrangement of IC elements on the tray and the pitch of arrangement of the testing stations poses a problem. For instance, when the chuck heads are arranged at the same pitch as that of the IC elements on the tray, a plurality of IC elements are chucked by the plurality of chuck heads at one time but they are mounted one by one on the testing stations. Where the chuck heads are arranged at the same pitch as that of the testing stations, the IC elements on the tray are chucked one by one but can be mounted on the testing stations at one time.

Thus, even if the IC chuck carrier is provided with a plurality of chuck heads, an inefficient operation is inevitably involved in the handling of IC elements either on the tray or on the testing station side, because of the difference between the pitch of arrangement of IC elements on the tray and the pitch of arrangement of the testing stations. Accordingly, it is hard to achieve the speed-up simply by providing a plurality of chuck heads. In this instance, it might be considered possible to arrange IC elements on the tray at the same pitch as that of the testing stations, but since there are formed a large number of wiring patterns in the testing stations (many wiring patterns being provided around the IC sockets), it is difficult to dispose a plurality of testing stations in close proximity to one another. On this account, if the pitch of arrangement of IC elements on the tray is selected equal to the pitch of arrangement of the testing stations, then the tray becomes large, introducing a disadvantage such as an increase in overall size of the test equipment or a decrease in the number of IC elements that can be carried at one time.

SUMMARY OF THE INVENTION

It is therefore an object of the present invention to provide IC test equipment of a structure which does not call for a large tray and by which a plurality of IC elements can simultaneously be chucked with chuck heads and attached to a plurality of testing stations at one time.

The IC test equipment of the present invention includes: a tray for loading a plurality of IC elements and carrying them to the vicinity of testing stations; an IC chuck carrier which chuck the IC elements from above by a plurality of chuck heads and attaches the chucked IC elements to the testing stations arranged at a pitch different from that of the IC elements arranged on the tray; and a pitch switching device provided on the IC chuck carrier, for selectively switching the pitch of arrangement of the chuck heads between the pitch of arrangement of IC elements on the tray and the pitch of arrangement of the testing stations.

With the structure according to the present invention, since the pitch of arrangement of the chuck heads can be switched by the pitch switching means between the pitch of arrangement of IC elements on the tray and the pitch of arrangement of the testing stations, not only the chuck of the IC elements from the tray but also attaching of them to the testing stations can be performed by one operation. This affords reduction of the number of operations involved, and hence speeds up the test of IC elements accordingly.

DESCRIPTION OF THE PREFERRED EMBODIMENTS

Figure 1:
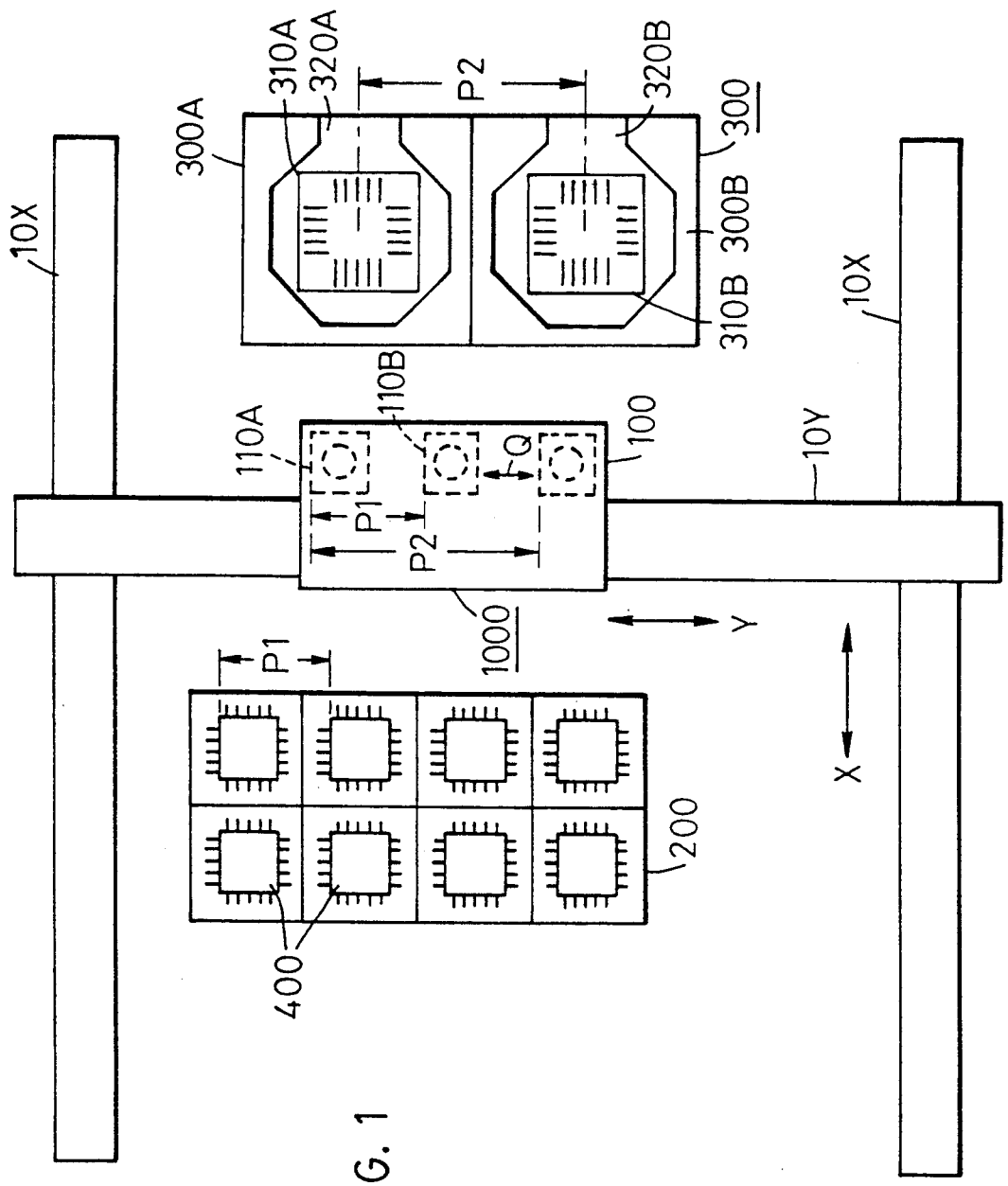
FIG. 1 is a plan view schematically illustrating an embodiment of the present invention.

FIG. 1 is a plan view schematically illustrating an embodiment of the IC test equipment according to the present invention. Mounted on X-axis rails 10X are a Y-axis rail 10Y which is movable thereon in the Y-axis direction, and the Y-axis rail 10Y carries an X-Y drive head 100 which is movable thereon in the Y-axis direction and forms the base of an IC chuck carrier 1000. Devices are provided for driving the Y-axis rail 10Y and the X-Y drive head 100, though not shown. The carrier 1000 is shown to have two chuck heads 110A and 110B. The chuck head 110A is fixed to the X-Y drive head 100, but the chuck head 110B is movable in the Y-axis direction to switch between pitches P1 and P2. On a performance board 300, IC sockets 310A and 310B are disposed side by side in the Y-axis direction at the pitch P2 on two testing stations 300A and 300B. Terminals of the IC sockets 310A and 310B are connected via terminal connection wires 320A and 320B to a tester (not shown). Test patterns are applied to the IC elements from the tester and response signals from the IC elements are provided to the tester.

When a tray 200 carrying IC elements 400 arranged at the pitch P1 has been brought, by transport means (not shown), a predetermined position shown in FIG. 1, the IC chuck carrier 1000 moves onto the tray 200 and two IC elements 400 are simultaneously chucked up from the tray 200 by the chuck heads 110A and 110B set to the pitch P1. Next, the carrier 1000 moves onto the performance board 300, and at the same time, the pitch of the chuck heads 110A and 110B is set to the pitch P2. Then the IC elements 400 are simultaneously lowered by the chuck heads 110A and 110B and are attached to the IC sockets 310A and 310B, after which predetermined tests are performed on the IC elements 400. After being tested, the IC elements 400 are simultaneously brought up from the IC sockets 310A and 310B set to the pitch P2 and are then set to the pitch P1, thereafter being brought back to the initial positions on the tray 200 or mounted on another tray (not shown), for example.

Figure 2:
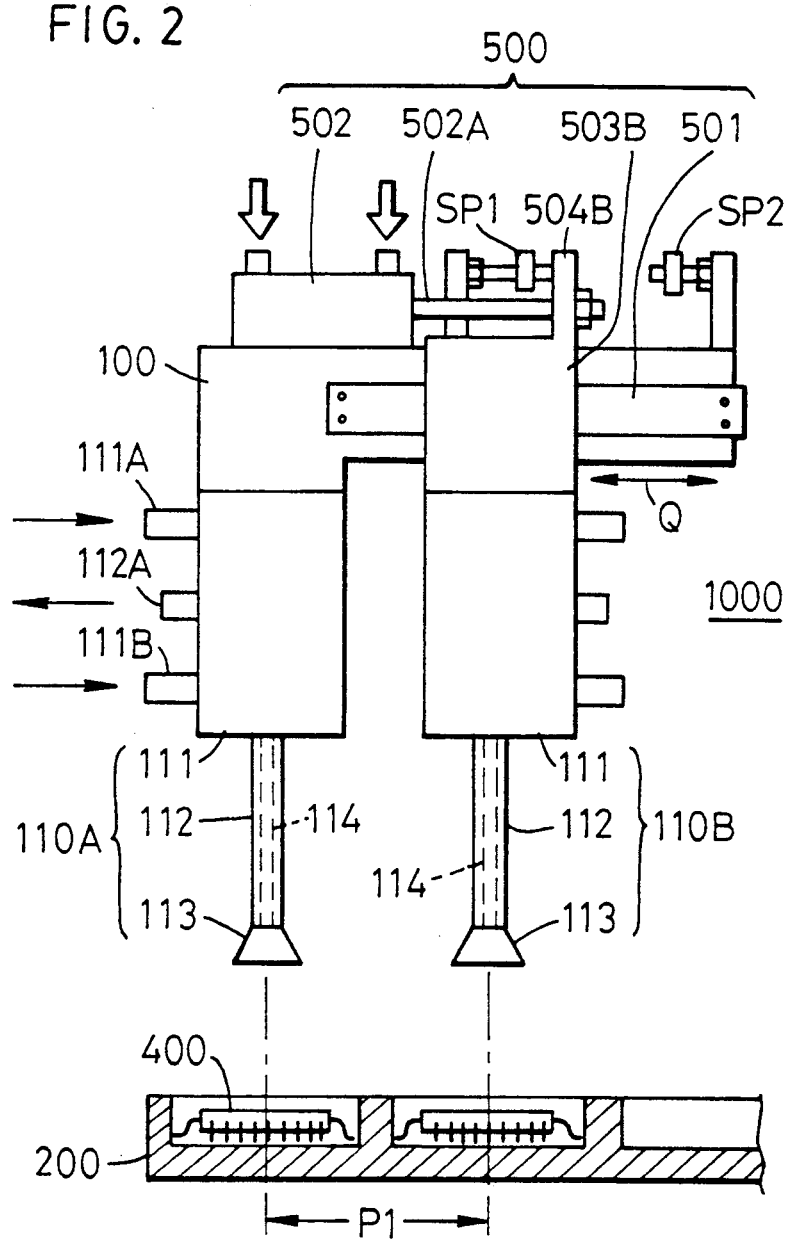
FIG. 2 is a side view of an IC chuck carrier set to a pitch P1 on the side of the IC tray.
Figure 3:
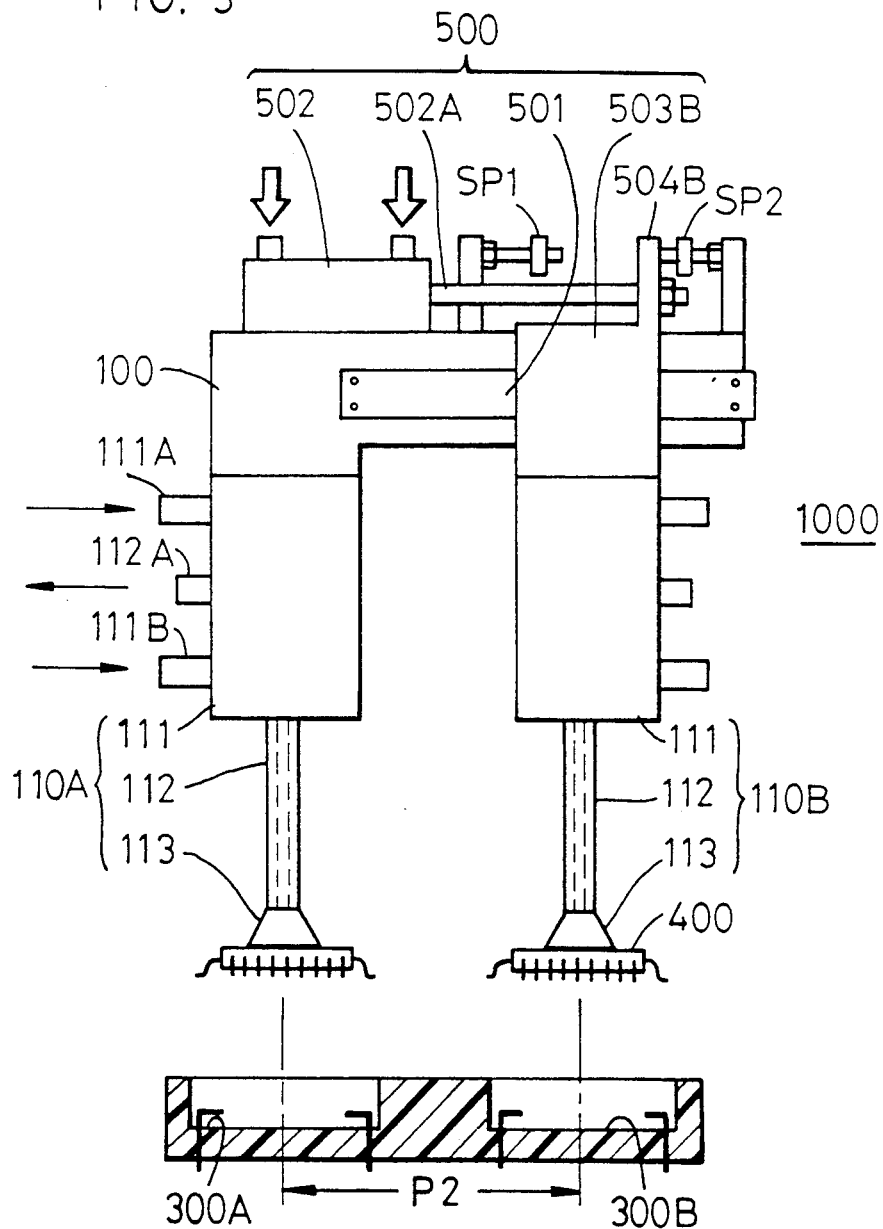
FIG. 3 is a side view of the IC chuck carrier set to a pitch P2 on the side of a performance board.

FIG. 2 shows the state in which the carrier 1000 stands opposite the tray 200. The carrier 1000 comprises the X-Y drive head 100 which is guided by the rails 10X and 10Y, the chuck heads 110A and 110B mounted on the drive head 100 and a pitch switching device 500. FIG. 3 shows the state in which the carrier 1000 lies opposite the testing stations 300A and 300B.

The carrier 1000 in this embodiment is shown to have two chuck heads 110A and 110B mounted on the X-Y drive head 100 (the X-Y drive mechanism being omitted for the sake of brevity). The chuck heads 110A and 110B each comprise a cylinder 111 with a rod 112 projecting therefrom downwardly and a suction pad 113 attached to the lower end of the rod 112. Each cylinder 111 in this example is an air cylinder. Reference numerals 111A and 111B indicate air inlet ports. When supplying compressed air to the air inlet ports 111A, the rods 112 project out downwardly and the suction pads 113 abut against the IC elements 400. Supplying compressed air to the air inlet ports 111B, the rods 112 move up.

Each suction pad 113 is in the form of sucking disc of an elastic material such as rubber. Each rod 112 has a through hole 114 along its axis, which hole communicates with an air suction port 112A. An air pump (not shown) is connected to the air suction port 112A to suck air from the central portion of the suction pad 113. When the suction pad 113 has approached the IC element 400, the latter is sucked by the former.

The chuck head 110A is fixed to the X-Y drive head 100, but the other chuck head 110B is movably supported by the pitch switching device 500 mounted on the X-Y drive head 100. The pitch switching device 500 is made up of a guide rail 501 fixedly mounted on one side of the X-Y drive head 100, a cylinder 502 fixedly mounted on the top of the X-Y drive head 100 in parallel to the guide rail 501, a carriage 503B movably supported on the guide rail 501, and stoppers SP1 and SP2 arranged in parallel to the guide rail 501 but opposite each other.

The cylinder 502 has its rod 502A connected to a drive plate 504B fixed to the carriage 503B and a part of the drive plate 504B lies between the stoppers SP1 and SP2, defining the movable range of the carriage 503B. The cylinder 111 of the chuck head 110B is attached to the lower end of the carriage 503B. The chuck head 110B is movably supported by the carriage 503B and is driven by the cylinder 502 in the direction of the arrow Q, by which the pitch is switched. That is, the stopper SP1 defines the pitch P1 equal to the pitch of arrangement of the IC elements 400 on the tray 200, whereas the other stopper SP2 defines the pitch P2 equal to the pitch of arrangement of the testing stations 300A and 300B shown in FIG. 1.

In the state in which the cylinder 502 has retracted the rod 502A, the drive plate 504B abuts against the stopper SP1, in which state the pitch of arrangement of the chuck heads 110A and 110B is defined to be the pitch P1 at which the IC elements 400 are arranged on the tray 200. When the cylinder 502 has fully extended its rod 502A as depicted in FIG. 3, the drive plate 504B abuts against the stopper SP2. In this state, the pitch of arrangement of the chuck heads 110A and 110B is defined to be the pitch P2 at which the testing stations 300A and 300B are arranged.

Thus, according to the present invention, when the chuck heads 110A and 110B move to the testing stations 300A and 300B after sucking up two IC elements 400 from the tray 200, the pitch of the chuck heads 110A and 110B can be switched to the pitch of arrangement of the testing stations 300A and 300B while the chuck heads 110A and 110B are moving toward the testing stations 300A and 300B. Consequently, when having reached their predetermined positions above the testing stations 300A and 300B, the chuck heads 110A and 110B are arranged at the pitch P2 equal to that of the testing stations 300A and 300B, so that the IC elements 400 carried by the chuck heads 110A and 110B can be mounted on the testing stations 300A and 300B by extending the rods 112 of the two cylinders 111. After mounting the IC elements 400 on the testing stations 300A and 300B, the air pump connected to the air suction ports 112A are stopped or the air suction passages are cut off, by which the rods 112 can be raised, leaving the IC elements 400 on the testing stations 300A and 300B.

Figure 4:
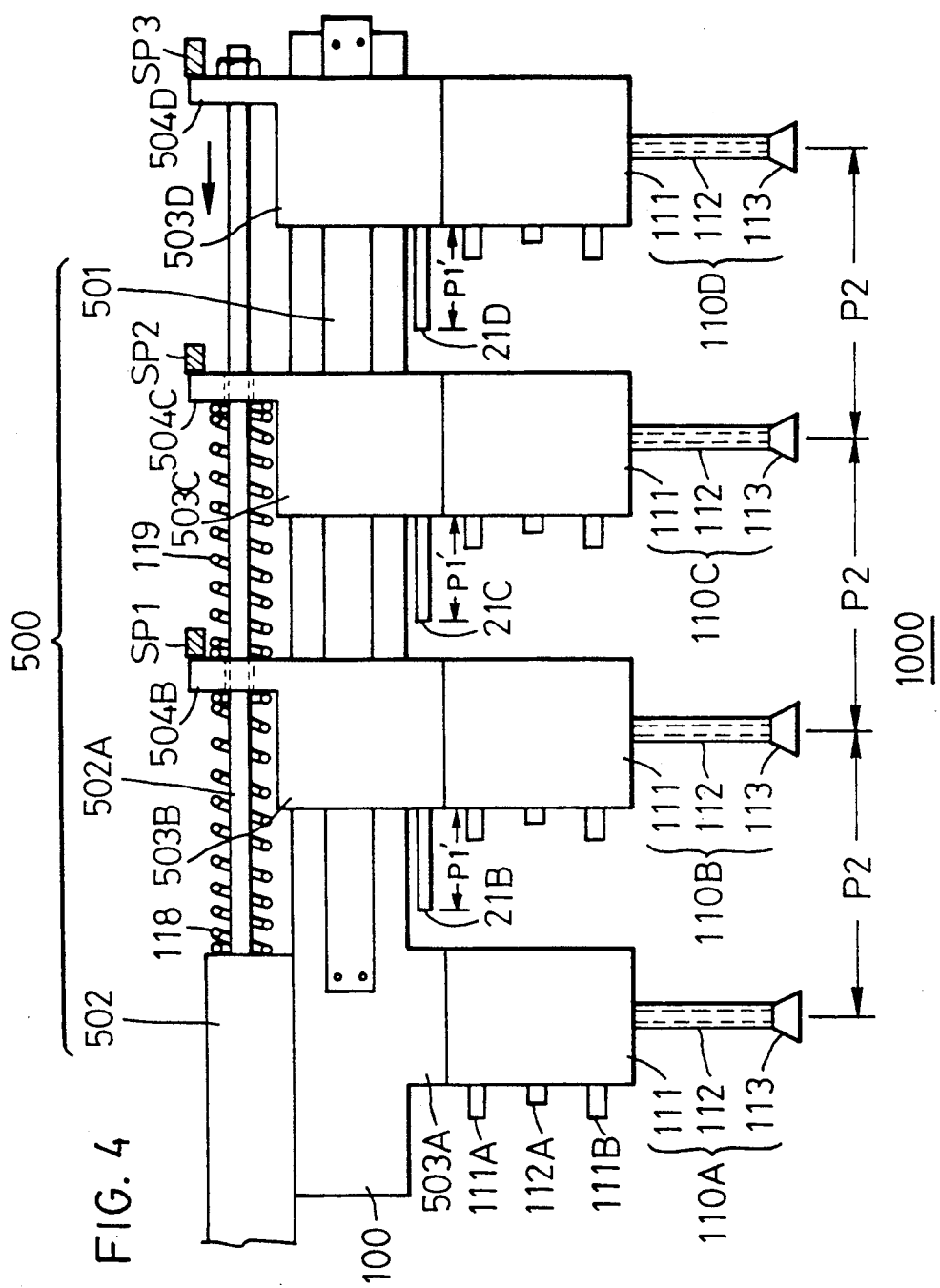
FIG. 4 is a side view of an IC chuck carrier in another embodiment of the present invention.

FIG. 4 illustrates a modified form of the present invention in which three or more chuck heads are mounted on the guide rail 501. In this example, four chuck heads 110A to 110D are employed and the pitch of their arrangement is changed by the pitch switching device 500.

The chuck head 110A is fixed to a stationary block 503A and the other three chuck heads 110B, 110C and 110D are movably supported on the guide rail 501 by means of carriages 503B, 503C and 503D, respectively. A drive plate 504D of the carriage 503D carrying the chuck head 110D is fixedly attached to the tip of the rod 502A of the cylinder 502, whereas drive plates 504B and 504C of the carriage 503B and 503C carrying the other two chuck heads 110B and 110C are slidably held on the rod 502A. Springs 118 and 119 are put on the rod 502A. The spring 118 is interposed between the main body of the cylinder 502 and the drive plate 504B, and the spring 119 is interposed between the drive plates 504B and 504C. The springs 118 and 119 bias the drive plates 504B and 504C in a direction in which they go away from the cylinder 502.

On the carriages 503B, 503C and 503D limit bars 21B, 21C and 21D of lengths P1' which provide the pitch P1 of arrangement of the IC elements 400 on the tray 200 to the chuck heads 110A to 110D are provided protrusively toward the neighboring stationary block 503A and the carriages 503B and 503D, respectively. When the cylinder 502 has retracted the rod 502A, the limit bar 21D of the carriage 503D strikes against the carriage 503C and then moves it toward the cylinder 502 against the force of the springs 118 and 119. As a result of this, the carriage 503B also moves toward the cylinder 502. It can easily be understood that the carriage 503B starts to move before or after the limit bar 503B strikes against the carriage 503B after the carriage 503C has started its movement, depending on which of the springs 118 and 119 is greater in the biasing force. At any rate, the limit bars 21B, 21C and 21D ultimately abut against the stationary block 503A and the carriages 503B and 503C, respectively. The lengths P1' of the limit bars 21B, 21C and 21D are chosen so that, in the above state, the pitch of arrangement of the chuck heads 110A to 110D is defined, by the lengths P1' of the limit bars 21B to 21C, to be equal to the pitch P1 of arrangement of the IC elements on the tray 200.

When the cylinder 502 has extended the rod 502A, the drive plate 504B of the carriage 503B is moved by the biasing force of the spring 118 until it abuts against the stopper SP1, the drive plate 504C of the carriage 503C is moved by the biasing force of the spring 119 until it abuts against the stopper SP2, and the drive plate 504D of the carriage 503D is moved by the thrust of the rod 502A until it abuts against the stopper SP3. When the drive plates 504B, 504C and 504D thus abut against the stoppers SP1, SP2 and SP3, respectively, the pitch of arrangement of the chuck heads 110A to 110D is equal to the pitch P2 of arrangement of the testing stations.

As described above, according to the present invention, in the IC test equipment employing the horizontal carrier system a plurality of chuck heads are provided on the IC chuck carrier and are adapted to be switched between the pitch of arrangement of IC elements loaded on the tray and the pitch of arrangement of the testing stations, so that a plurality of IC elements can be transferred by one operation from the tray to the testing stations and thence to another tray. This increases the IC transfer speed, and hence reduces the IC testing time. Moreover, since the pitch of arrangement of IC elements on the tray need not be made equal to the pitch of arrangement of the testing stations, the IC transfer speed can be raised without making the test equipment bulky.

It will be apparent that many modifications and variations may be effected without departing from the scope of the novel concepts of the present invention.

What is claimed is:

1. IC test equipment comprising:
   X-axis and Y-axis rails;
   a tray carrying a plurality of IC elements arranged at a first pitch and disposed at a predetermined first position;
   a performance board having a plurality of testing stations arranged at a second pitch and provided at a second position;
   IC chuck carrier means which has a plurality of arranged chuck head means, for chucking a plurality of IC elements by said chuck head means from above said tray at said first position and is guided by said X-axis and Y-axis rails to said second position to attach said chucked IC elements to said plurality of testing stations; and
   pitch switching means provided on said IC chuck carrier means, for selectively setting the pitch of said plurality of chuck head means to either one of said first and second pitches.

2. IC test equipment according to claim 1, wherein said IC chuck carrier means comprises:
   an X-Y drive head movably mounted on said X-axis and Y-axis rails;
   first chuck head means which is one of said plurality of chuck head means and is fixed to said X-Y drive head;
   second chuck head means which is another one of said plurality of chuck head means and is mounted on said X-Y drive head in a manner to be movable along a predetermined straight line; and
   linear drive means, mounted on said X-Y drive head, for driving said second chuck head means along said straight line.

3. IC test equipment according to claim 2, wherein said pitch switching means includes first and second stoppers mounted on said X-Y drive head at different positions in the direction of said straight line and a drive plate fixed to said second chuck head means and partly lying between said first and second stoppers, said first and second stoppers being positioned so that when said drive plate abuts against said first stopper, said first pitch is defined and when said drive plate abuts against said second stopper, said second pitch is defined.

4. IC test equipment according to claim 3, wherein said linear drive means comprises an air cylinder having a rod which is extended and retracted in the direction of said straight line by pneumatic driving.

5. IC test equipment according to claim 2, wherein said plurality of chuck head means includes third chuck head means, disposed between said first and second chuck head means and mounted on said X-Y drive head in a manner to be movable along said straight line.

6. IC test equipment according to claim 5, wherein said pitch switching means comprises:
   first and second drive plates fixed to said second and third chuck head means, respectively;
   first and second stoppers fixed to said X-Y drive head, for inhibiting movement of said first and second drive plates abutting against said second and third chuck head means on a side opposite from said first chuck head means when said second and third chuck head means are respectively at a position to define said second pitch; and
   first and second limiter means provided between said first and third chuck head means and between said third and second chuck head means, respectively, for inhibiting their spacing from becoming smaller than that defining said first pitch.

7. IC test equipment according to claim 6, wherein said linear drive means is an air cylinder having a rod which is extended and retracted by pneumatic driving in the direction of said straight line and fixed to said X-Y drive head,
   wherein said first drive plate is fixed to said rod and said second drive plate is slidably held on said rod in the direction of said straight line, and
   wherein a spring is provided between the body of said air cylinder and said second drive plate, for applying a biasing force to said second drive plate in the direction of said second stopper.

* * * * *